(12) United States Patent
Pedersen et al.

(10) Patent No.: US 9,922,684 B2
(45) Date of Patent: Mar. 20, 2018

(54) MEMORY DEVICE ULTRA-DEEP POWER-DOWN MODE EXIT CONTROL

(71) Applicant: Adesto Technologies Corporation, Santa Clara, CA (US)

(72) Inventors: Bard M. Pedersen, Fremont, CA (US); Derric Lewis, Sunnyvale, CA (US); John Dinh, Dublin, CA (US); Gideon Intrater, Sunnyvale, CA (US); Nathan Gonzales, San Jose, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 15/409,270

(22) Filed: Jan. 18, 2017

(65) Prior Publication Data

US 2017/0236561 A1 Aug. 17, 2017

Related U.S. Application Data

(60) Provisional application No. 62/294,264, filed on Feb. 11, 2016.

(51) Int. Cl.
*G11C 5/14* (2006.01)
*G11C 11/4074* (2006.01)

(52) U.S. Cl.
CPC .............. *G11C 5/148* (2013.01); *G11C 5/147* (2013.01); *G11C 5/14* (2013.01); *G11C 11/4074* (2013.01)

(58) Field of Classification Search
CPC ........ G11C 5/147; G11C 5/14; G11C 11/4074
USPC ......................................................... 365/226
See application file for complete search history.

(56) References Cited

U.S. PATENT DOCUMENTS 9,037,890 B2 5/2015 De Caro et al.
2006/0143485 A1* 6/2006 Naveh .................. G06F 1/3203
713/320

\* cited by examiner

*Primary Examiner* — Jason Lappas
(74) *Attorney, Agent, or Firm* — Michael C. Stephens, Jr.

(57) ABSTRACT

A memory device operable in an ultra-deep power-down mode can include: a command user interface; a voltage regulator having an output that provides a supply voltage for a plurality of components of the memory device, where the plurality of components comprises the command user interface; a wake-up circuit that remains powered on even when the memory device is in the ultra-deep power-down mode; the memory device being operable to enter the ultra-deep power-down mode in response to receiving a first predetermined command that causes the output of the voltage regulator to be disabled to completely power down the plurality of components during the ultra-deep power-down mode; and the memory device being operable to exit the ultra-deep power-down mode in response to receiving one of a hardware reset command sequence, a reset pin assertion, a power supply cycling, and a second predetermined command.

18 Claims, 8 Drawing Sheets

MEMORY DEVICE ULTRA-DEEP POWER-DOWN MODE EXIT CONTROL

RELATED APPLICATIONS

This application claims the benefit of U.S. Provisional Application No. 62/294,264, filed Feb. 11, 2016, and which is incorporated herein by reference in its entirety.

FIELD OF THE INVENTION

The present invention generally relates to the field of semiconductor devices. More specifically, embodiments of the present invention pertain to power control modes of memory devices.

BACKGROUND

Memory devices can employ various modes whereby certain circuitry is disabled in order to reduce the power consumption of the device. In many portable, battery-powered applications, power consumption is particularly important. Examples of such applications may include cellular phones, pagers, camera recorders, and laptops. These applications/devices typically demand the lowest power consumption possible in order to prolong battery life and to accommodate the use of smaller, lower capacity batteries in order to reduce the device size, cost, and weight.

DETAILED DESCRIPTION OF EMBODIMENTS

Figure 1:
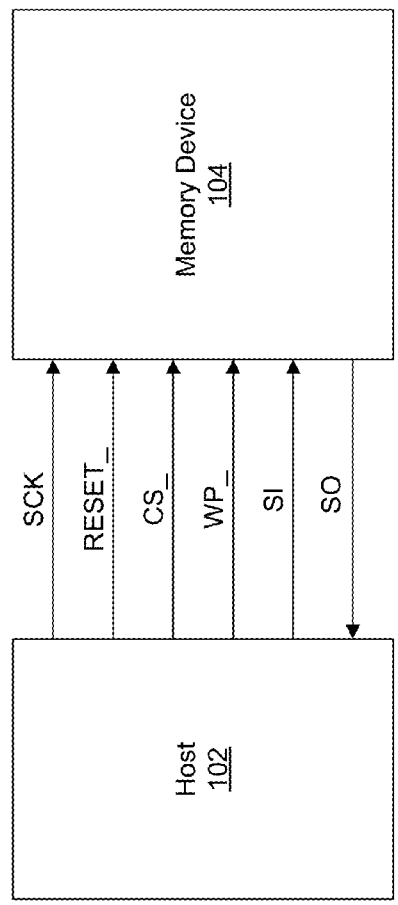
FIG. 1 is a schematic block diagram of an example host and memory device arrangement, in accordance with embodiments of the present invention.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Particular embodiments may be directed to memory devices, including volatile (e.g., SRAM, DRAM, etc.) or non-volatile memory (NVM) devices, such as flash memory, R-RAM, M-RAM, E2ROM, and CBRAM, to name a few. Particular embodiments can include structures and methods of operating flash and/or resistive switching memories that can be written (programmed/erased) between one or more resistance and/or capacitive states. In one example, a CBRAM storage element may be configured such that when a forward or reverse bias greater than a threshold voltage is applied across electrodes of the CBRAM storage element, the electrical properties (e.g., resistance) of the CBRAM storage element can change. A write operation may be any operation on a memory (e.g., NVM) device that is intended to change a state of at least one of the memory locations on the device. Further, write operations can include program operations (e.g., to change a data state from 1 to 0) and erase operations (e.g., to change a data state from 0 to 1). Of course, the data states and/or resistance levels of the storage element can be predefined in any suitable way; however, the write operation can generally involve ensuring that a memory cell is put into or remains in the desired state. In any event, certain embodiments are suitable to any type of memory device, including both volatile and non-volatile types/devices, and that may include resistive switching memory devices.

In one embodiment, a memory device operable in an ultra-deep power-down mode, can include: (i) a command user interface; (ii) a voltage regulator having an output that provides a supply voltage for a plurality of components of the memory device, where the plurality of components comprises the command user interface; (iii) a wake-up circuit that remains powered on even when the memory device is in the ultra-deep power-down mode; (iv) the memory device being operable to enter the ultra-deep power-down mode in response to receiving a first predetermined command that causes the output of the voltage regulator to be disabled to completely power down the plurality of components during the ultra-deep power-down mode; and (v) the memory device being operable to exit the ultra-deep power-down mode in response to receiving one of a hardware reset command sequence, a reset pin assertion, a power supply cycling, and a second predetermined command, thereby causing the output of the voltage regulator to be enabled to provide power to the plurality of components.

Referring now to FIG. 1, shown is a schematic block diagram 100 of an example host and memory device arrangement, in accordance with embodiments of the present invention. In this example, host 102 can interface with memory device 104 via a serial interface. For example, host 102 can be any suitable controller (e.g., CPU, MCU, general-purpose processor, GPU, DSP, etc.), and memory device 404 can be any type of memory device (e.g., SRAM, DRAM, EEPROM, Flash, CBRAM, magnetic RAM, ReRAM, etc.). Memory device 104 can thus be implemented in a variety of memory technologies, such as non-volatile types. In some cases, memory device 104 can be a serial flash memory that may be implemented in more traditional types of non-volatile memories, or in CBRAM/ReRAM resistive switching memories.

Various interface signals, such as in a serial peripheral interface (SPI) interface, can be included for communication between host 102 and memory device 104. In this example Single SPI configuration/mode, serial clock (SCK) can provide a clock to device 104, and may be used to control the flow of data to and from the device. Command, address, and input data (e.g., on the SI pin) can be latched on a rising edge of SCK, while output data (e.g., on the SO pin or via I/O pins) can be clocked out on a falling edge of SCK, or by a data strobe in some arrangements. The reset pin (RESET_) can be used to terminate an operation in progress, and to reset an internal state machine of memory device 104 (e.g., to an idle state). Memory device 104 can remain in the reset condition as long as a low level is present on the reset pin. Also, because memory device 104 can include power-on reset circuitry, there may be no restrictions on the reset pin during power-on sequences. In some other implementations, memory device 104 may not include the reset pin (RESET_), and may instead include a hold pin (HOLD_).

Chip select (CS_) can be utilized to select memory device 104, such as from among a plurality of such memory devices, or otherwise as a way to access the device. When the chip select signal is de-asserted (e.g., at a high level), memory device 104 will also be deselected, and may be placed in a standby mode. Activating the chip select signal (e.g., via a high to low transition on CS_) may be utilized to start an operation, and returning the chip select signal to a high state can be utilized for terminating an operation. For internally self-timed operations (e.g., a program or erase cycles), memory device 104 may not enter standby mode until completion of the particular ongoing operation if chip select is de-asserted during the operation. Write protect (WP_) can be utilized for protection of sectors specified for protection by a register (e.g., the sector protection register). For example, such sectors may be protected against program and erase operations. Thus, if a program or erase command is issued to memory device 104 while the write protect pin is asserted, the device may ignore the command and perform no operation.

In this example SPI interface, which may be a "single SPI mode," data can be provided to memory device 104 via a serial input (SI) signal. The serial input can be utilized for data input including command and address sequences. For example, data on the serial input pin can be latched on a rising edge of SCK, and data on the serial input pin can be ignored if the device is deselected (e.g., when the chip select signal is de-asserted). Data can be output from memory device 104 via a serial output (SO) signal. For example, data on the serial output can be clocked out on falling edges of SCK, and the serial output signal can be in a high impedance state when the device is deselected (e.g., when the chip select signal is de-asserted). In particular embodiments, memory device 104 may support a variety of SPI modes or configurations, such as single SPI, QPI, and octal modes. Further, the interface mode of memory device 104 can be changed to the single SPI mode, regardless of the present interface mode, in response to a write command in which automatic entry into a power down mode results after completion thereof.

Memory device 104 can include a voltage regulator with an output that provides a voltage supply for various other components of the memory device, including a command user interface. The memory device may be placed into an ultra-deep power-down (UDPD) mode by providing (e.g., from host 102) a predetermined command over the interface to the memory device. The UDPD mode can cause the output of the voltage regulator, along with appropriate generations circuitry therein, to be disabled. In order to bring memory device 104 out of the ultra-deep power-down mode, a wake-up signal or other command may be provided to the memory device.

To accommodate this operation, memory device 104 can include a wake-up circuit that remains powered on even when the memory device is in the ultra-deep power-down mode. Receipt of the wake-up signal or command while the memory device is in the ultra-deep power-down mode can cause the output of the voltage regulator and associated circuitry to be enabled, thereby providing power to the components that were previously powered down. As will be discussed in more detail below, in certain embodiments, additional functionality can be included in the wake-up related circuitry or UDPD control that may remain powered on even when the memory devices in the ultra-deep power-down mode.

Many of applications use flash memory devices in order to store program code. In some cases, the program code may be copied to external or embedded microcontroller RAM after the application powers up. Since the code in this case is shadowed from the flash memory into RAM, the flash memory may not need to be accessed until the next power cycle. Thus, it can be desirable to place the flash memory device into as low a power mode as possible so as to consume the least amount of current. Along these lines, some applications completely remove power from the flash memory device in order to reduce the power consumption. However, this approach may tend to increase application complexity and/or cost because an external power management device, such as a low drop-out (LDO) regulator, may be utilized in order to cut the power to the flash memory device.

For example, memory device 104 can operate in an ultra-deep power-down mode in which only a very small amount of current is drawn from the device. In some implementations, the ultra-deep power-down mode may allow the average current consumption to be reduced to below one micro-amp (uA), and in some cases, as low as 50 nano-amps (nA). In one aspect, memory device 104 can include a voltage regulator having an output that provides a voltage supply for various other components of the memory device, including a command user interface. The memory device may be placed into an ultra-deep power-down mode by providing (e.g., from host 102) to the memory device a predetermined command that causes the output of the voltage regulator (and associated regulation circuitry) to be disabled.

To bring the memory device out of the ultra-deep power-down mode, a wake-up signal or command can be provided to the memory device. The memory device can include a wake-up circuit that remains powered on even when the memory device is in the ultra-deep power-down mode. Receipt of the wake-up signal or command while the memory device is in the ultra-deep power-down mode may then cause the output of the voltage regulator (and associated regulation circuitry) to be enabled, thereby providing power to the components that were completely previously powered down. Other aspects relate to methods and systems involving a memory device that is operable in an ultra-deep power-down mode.

In certain embodiments, the memory device can be placed into the ultra-deep power-down mode, and can exit the ultra-deep power-down mode, in a manner that saves a general purpose input/output (GP I/O) pin on the master host processor (e.g., 102) for other system functions. Also, by placing the memory device into the ultra-deep power-down mode using an opcode, greater flexibility can be provided. Furthermore, more complex, external power management devices, such as a low drop-out (LDO) regulators, can be eliminated in order to reduce overall costs. In addition, reliability of the overall system may be enhanced through the use of fewer components.

Figure 2:
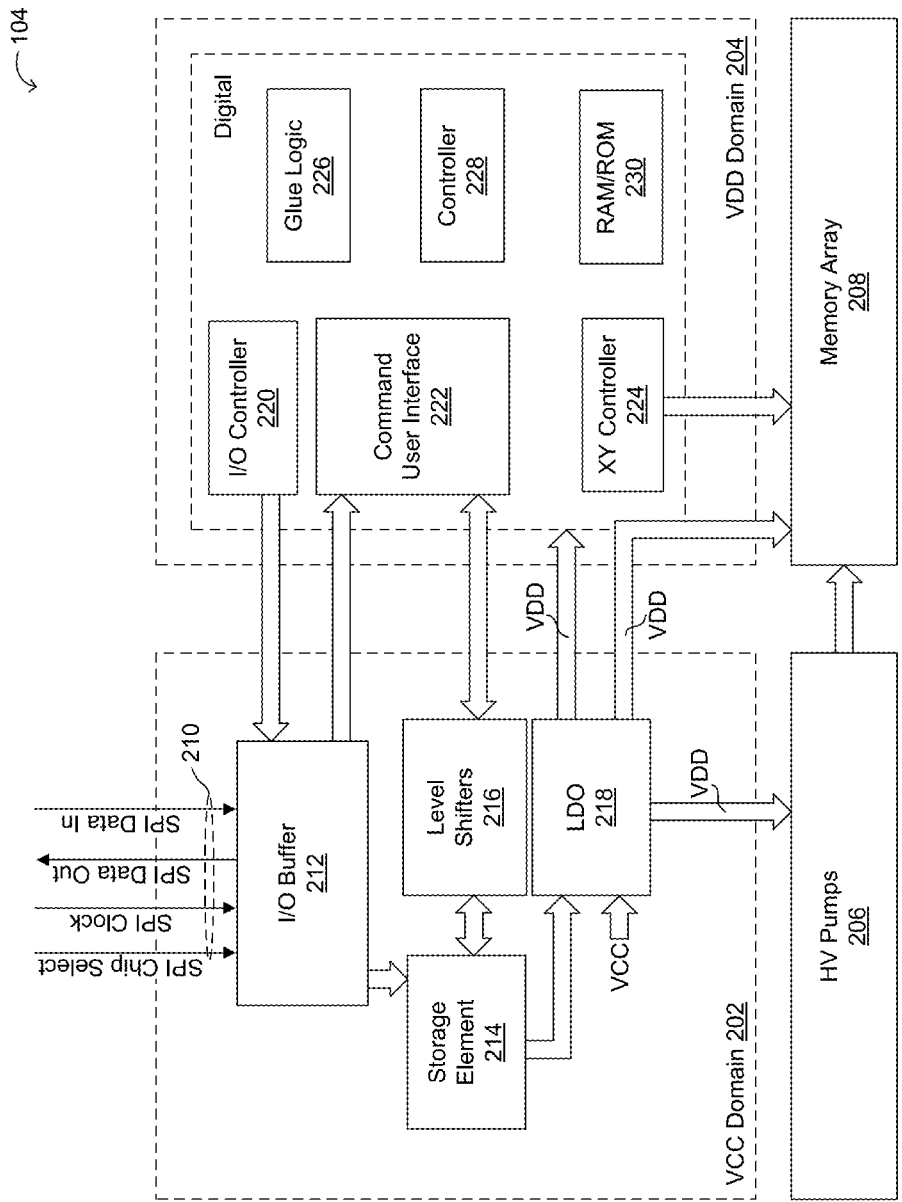
FIG. 2 is a schematic block diagram of various example data processing units in a memory device, in accordance with embodiments of the present invention.

Referring now to FIG. 2, shown is a schematic block diagram of various example data processing units in a memory device, in accordance with embodiments of the present invention. In general, memory device 104 can include VCC domain blocks (e.g., functional blocks or circuits that are powered by and operate using VCC power) 202, VDD domain blocks (e.g., functional blocks or circuits that are powered by and operated using a reduced or different power level VDD) 204, high voltage (HV) charge pumps 206, and memory array 208. The memory device 104 itself can be powered by an external VCC power supply, and can include low drop-out (LDO) regulator 218 having an output that serves as an internal on-chip voltage supply to provide the VDD voltage level to VDD domain blocks 204, high voltage charge pumps 206, and memory array 208. Accordingly, VDD domain blocks 204, high voltage charge pumps 206, and memory array 208 may be powered by LDO regulator 218.

In this particular example, VCC domain blocks 202 may also include input/output buffer 212, level shifters 216, and storage element 214. For example, storage element 214 (e.g., latch, flip-flop circuit, etc.) can store the enabled/disabled state of LDO regulator 218. In addition, VDD domain blocks 204 can include various digital circuits, such as controller 228, input/output (I/O) controller 220, memory 230 (e.g., RAM and/or ROM), command user interface (CUI) 222, glue logic 226 in order to interface between other logic units, and XY controller 224 that interfaces with memory array 208. Level shifters 216 may be digital transfer devices that convert signals between the VCC and VDD supply domains. In some cases, the VCC domain may operate with 2.5 volts, whereas the VDD domain may operate with 1.8 volts, but these voltages may differ in other implementations.

Operation of memory device 104 can be controlled by instructions from host processor 102. In this particular example, a valid instruction starts with the falling edge of the CS_ signal, followed by an 8-bit operation code (opcode) along with the buffer or main memory address location. In some cases, memory device 104 can store program code, which may be copied into external RAM or RAM embedded in host processor 102 after power up of the given application. If memory device 104 does not need to be accessed until the next power cycle, it may be desirable to place memory device 104 into as low a power mode as possible so as to consume the least amount of current. There also may be other situations in which it is desirable to place memory device 104 into such a power-down mode.

As discussed above, memory device 104 can be placed in an ultra-deep power-down mode in which only a very small amount of current is drawn from the device. In some implementations, the ultra-deep power-down mode can allow the average current consumption to be reduced to well below one micro-amp ($\mu A$), and in some cases, as low as 50 nano-amps (nA). In this way, the current consumption may be reduced by almost a factor of ten when the device is operated in the ultra-deep power-down mode, as compared to normal operation. However, the actual power consumption in the ultra-deep power-down mode may differ in other implementations. In any event, the power consumption of the memory device may be substantially reduced when in the ultra-deep power-down mode.

The ultra-deep power-down mode can completely turn off the components of memory device 104 that operate in the VDD domain (e.g., 204). Further, various approaches for exiting memory device 104 from the ultra-deep power-down mode can be supported in certain embodiments. For example, a hardware reset command sequence (see, e.g., FIG. 4), hardware reset pin assertion (see, e.g., FIG. 5), a power/VCC cycling, and a predetermined SPI command (see, e.g., FIG. 7) may be supported such that either one of these results in memory device 104 exiting from the ultra-deep power-down mode.

Entering the ultra-deep power-down mode can be accomplished by providing a unique predetermined 8-bit command opcode from host processor 102 to I/O buffer 212 over the SPI bus 210. After receiving the unique command opcode, buffer 212 may pass the unique command opcode to command user interface 222. Command user interface 222 can then pass the opcode to level shifter 216 that is associated with decoding the command. Level shifter 216 can convert the opcode to the appropriate VCC domain voltage level, and may transfer the opcode to storage element 214 (e.g., a flip-flop circuit). Storage element 214 may then generate a signal to cause the output of LDO regulator 218 to be disabled. Disabling the output of LDO regulator 218 can power off VDD domain blocks 204 of memory device 212, as well as memory array 208, and high voltage charge pumps 206. Thus, in the ultra-deep power-down mode, all components that normally are powered by the VDD voltage supply can be completely powered down. By shutting down additional internal circuitry in memory device 104, the ultra-deep power-down mode can allow memory device 104 to consume less power as compared to other low power or standby modes.

Since almost all active circuitry is shut down in the ultra-deep power-down mode to conserve power, input/output controller 220 and command user interface 222 can be completely powered down during the ultra-deep power-down mode. Since any additional data clocked into memory device 104 after the memory device enters the ultra-deep power-down mode (and before it exits that mode) may be ignored, all subsequent commands may also be ignored until the device exits the ultra-deep power-down mode. On the other hand, as all such commands may be ignored, the ultra-deep power-down mode can be used as an extra protection mechanism against program and erase operations. However, as will be discussed in more detail below, all such subsequent commands may not be ignored, and predetermined certain command(s) may be accepted, such as the one shown below in FIG. 7 that provides a way to exit the ultra-deep power-down mode.

When memory device 104 is in the ultra-deep power-down mode, the device can continue to be powered by the VCC voltage, such that VCC domain blocks 202 (including storage element 214, LDO regulator 218, and I/O buffers 212) may remain connected to the VCC voltage. Nevertheless, in this state, LDO regulator 218, which can be implemented as a relatively small circuit, can have a relatively small amount of leakage, thereby helping to maintain the overall power consumption of memory device 104 at a relatively low level during the ultra-deep power-down mode.

The ultra-deep power-down mode can allow the device to further reduce its energy consumption as compared to the existing standby and deep power-down modes by shutting down additional internal circuitry. In "regular" deep power-down modes, as opposed to an ultra-deep power-down mode, LDO 218 may remain on, or otherwise the power to the memory array and other circuitry can remain on in cases where there is no LDO. In contrast, LDO 218 is turned off during the ultra-deep power-down mode in order to completely turn off all of the circuitry using the output thereof, including circuits in VDD domain 204, HV pumps 216, and memory array 208. When the memory device is in the ultra-deep power-down mode, the read status register command, along with the resume from ultra-deep power-down mode command (see, e.g., FIG. 7) may be the only commands that the device may recognize. When reading the status registers in this mode, all bits may read as "1", indicating that the device is in UDPD mode. All other commands, including the resume from deep power-down command, may be ignored, unless the same opcode (e.g., ABh) is employed for both the resume from the ultra-deep power-down mode command as well as the resume from deep power-down mode command, such that the same command can be used to wake up from both sleep modes. In any event, since all write commands may be ignored, the UDPD mode can essentially be used as an extra protection mechanism against inadvertent or unintentional program and erase operations in some applications.

Figure 3:
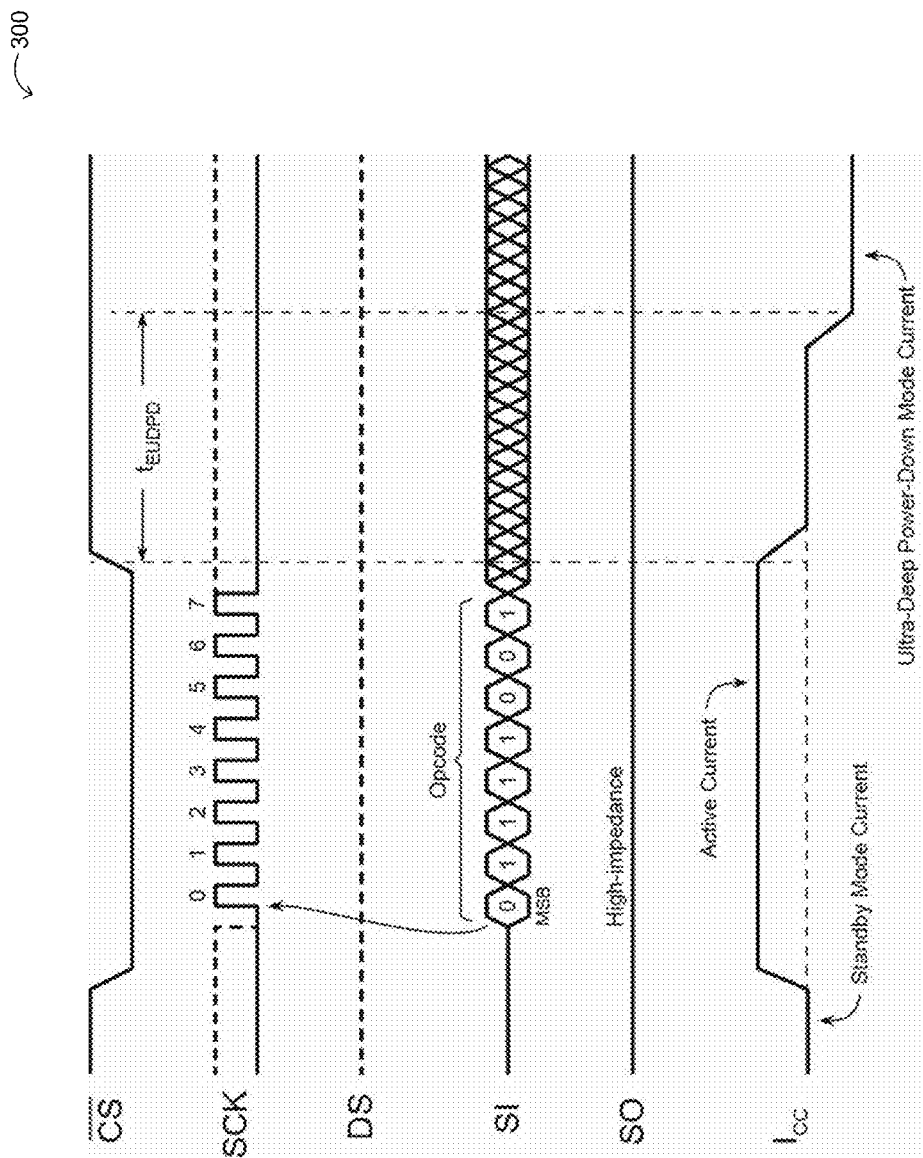
FIG. 3 is a waveform diagram of an example operation of entering ultra-deep power-down mode, in accordance with embodiments of the present invention.

Referring now to FIG. 3, shown is a waveform diagram 300 of an example operation of entering ultra-deep power-down mode, in accordance with embodiments of the present invention. Entering the ultra-deep power-down mode may be accomplished by simply asserting the CS_ pin, clocking in the opcode (e.g., 79h), and then de-asserting the CS_ pin. Any additional data clocked into the device after the opcode may be ignored. When the CS_ pin is de-asserted, the memory device may enter the ultra-deep power-down mode within the maximum time of $t_{EUDPD}$. For example, the complete opcode must be clocked in before the CS_ pin is de-asserted; otherwise, the device may abort the operation and return to the standby mode once the CS_ pin is de-asserted. In addition, the device may default to the standby mode after a power cycle. The ultra-deep power-down command may be ignored if an internally self-timed operation such as a program or erase cycle is in progress.

Particular embodiments may also support an "automatic" ultra-deep power-down mode entry after a program or erase operation that can allow the memory device to further reduce its energy consumption by automatically entering the ultra-deep power-down mode, after completing an internally timed program or erase operation. The program or erase operation can be any one of the block or chip erase commands, byte/page program command, or buffer to main memory page program without built-in erase commands. Note that the buffer write command or any of the register write commands may not cause the device to go into the ultra-deep power-down mode. In any event, regardless of how the memory device enters the ultra-deep power-down mode (e.g., via a direct command or automatically), particular embodiments provide a variety of control mechanisms for exiting the ultra-deep power-down mode.

The "auto" ultra-deep power-down (AUDPD) mode after program/erase operation can be enabled by setting, e.g., the auto ultra-deep power-down enable bit in a status/control register. AUDPD may be cleared every time the device goes into ultra-deep power-down, so it can be set again if another program or erase operation followed by auto ultra-deep power-down is desired. When using auto ultra-deep power-down mode after program/erase operation, the memory device may switch to the standard SPI mode within $t_{AUDPD}$ after the program or erase command is initiated. All status read operations, both while the program or erase operation are still in progress and after the device has entered ultra-deep power-down mode, can therefore be performed using the standard SPI mode.

In some cases, all input pins may have to be at valid CMOS levels in order to minimize power consumption in the ultra-deep power-down mode. Upon recovery/exit from ultra-deep power-down, all internal registers (e.g., except the write completion status bit in a status/control register) may be at the power-on default state. In addition, memory device 104 may wake up in single SPI mode even if it was in QPI or octal mode, including double or multiple data rates, when it entered ultra-deep power-down. In some implementations, the ultra-deep power-down command may be ignored if an internally self-timed operation, such as a program or erase cycle, are in progress. As noted above, I/O controller 220 and command user interface 222 may be completely powered down during the ultra-deep power-down mode. As such, typically all opcode commands may be ignored by memory device 104 when the device is in the ultra-deep power-down mode. However, certain embodiments may support a predetermined opcode command sent over the SPI data in line of SPI bus 210 that may be used to bring memory device 104 out of the ultra-deep power-down mode (see, e.g., FIG. 7).

In one example, in order to wake memory device 104 and bring it out of the ultra-deep power-down mode, merely toggling the signal on the SPI CS_ line of SPI bus 210 will not be effective. Rather, a predetermined opcode (e.g., ABh) may be provided and decoded via dedicated circuitry in I/O buffer 212 and storage element 214. When memory device 104 is in the ultra-deep power-down mode, buffer 212 may clock in and pass the serial input signals directly to storage element 214, which can generate a signal to cause the output of LDO regulator 218 to be enabled in the event of a match of the predetermined opcode. Enabling the output of LDO regulator 218 can provide the VDD voltage to the various VDD domain blocks 204, as well as to high voltage charge pumps 206 and memory array 208, thus restoring memory device 104 to the standby mode. Thus, although memory device 104 is placed into the ultra-deep power-down mode using a certain command (e.g., the opcode), the memory device can be brought out of the ultra-deep power-down mode using appropriate hardware features of memory device 104, or a different command/opcode.

In particular embodiments, the chip select signal can alternatively be used for other purposes than getting the memory device out of the ultra-deep power-down mode. In this case, the chip select signal can be utilized in order to send the memory device a command without waking the device up. In this way, other wake-up signals or commands can be employed in order to exit the ultra-deep power-down mode. For example, the status read command, along with a dedicated wake-up from ultra-deep power-down command (e.g., opcode=ABh), can be employed in order to control memory device 104 to exit from the ultra-deep power-down mode. In one example, the status read command can provide status data while not bringing the memory device out of the ultra-deep power-down mode, while the wake-up from ultra-deep power-down command may be an SPI command that brings memory device 104 out of ultra-deep power-down mode.

In some cases, the wake-up from ultra-deep power-down command may be the same as an existing command that is utilized for wake-up from a standard (not quite ultra-deep) power down mode. In other cases, a different wake-up from ultra-deep power-down command can be employed. The wake-up from power down command or "resume from deep power-down" command can be a standard SPI command, following a normal SPI command sequence. This may be as opposed to an exit ultra-deep power-down or hardware reset command sequence (e.g., JEDEC hardware reset) that can act as a substitute for a hardware reset pin. Such a hardware reset command can include a sequence of signals that should never occur during normal SPI operation. As such, the hardware reset command along these lines can be employed as another alternative to wake-up/exit from ultra-deep power-down mode.

To exit from the ultra-deep power-down mode, particular embodiments may support a hardware reset command sequence, exercising the hardware RESET_ pin, a power cycling (e.g., of main power supply VCC), or a dedicated/predetermined SPI command that may be the only recognizable command by the memory device when in ultra-deep power-down. Upon recovery from ultra-deep power-down, all internal volatile registers may be at their power-on default state. One exception can be a write completion status bit in a status/control register whereby even though such a status bit may be a volatile bit, it may not be cleared when the device enters auto ultra-deep power-down. This can be to ensure that an error can still be detected after an auto ultra-deep power-down program or erase operation. In this case, the write completion status bit may not be erased by a hardware reset or by exercising the RESET_ pin. However, it may be erased by a full power cycle, or if the ultra-deep power-down (e.g., 79h) command was used to enter UDPD mode.

The memory device may wake-up in SPI mode even if the device was in QPI or octal mode when the memory device entered ultra-deep power-down. In this case, the system must wait for the device to return to the standby mode before normal command operations can be resumed. The exit ultra-deep power-down predetermined opcode (e.g., ABh), or a hardware reset command sequence can be used to wake up the device from ultra-deep power-down. This sequence can also be used to reset the device to its power on state without cycling power, which is another supported approach to exiting ultra-deep power-down mode. The hardware RESET_ pin can also be asserted in order to wake up the device from ultra-deep power-down. This option can also be used to reset the device to a state similar to the power on state without cycling power.

After a hardware reset while the device is in the ultra-deep power-down mode, the SRAM buffer 212 may be reset to an undefined value. All volatile status registers may be reset to their default values, except in the following case: If a bit (e.g., the AUDPD bit) in a status/control register was set prior to the last program or erase command, so the device automatically entered the ultra-deep power-down mode after a program or erase command finished, and the hardware reset is used to wake up the device from ultra-deep power-down mode, then the write completion status bit may not be reset. In this case, the write completion status may still show the correct status after the latest program or erase command. All non-volatile status registers may maintain the value they had prior to reset.

After a hardware reset while the device is in any other mode than ultra-deep power-down mode, the SRAM buffer may keep the values it had prior to reset, with the following exception. If the reset sequence is initiated during an update of the SRAM buffer, the contents of the SRAM buffer may be corrupted. All volatile status registers may be reset to their default values. All non-volatile status registers may keep the value they had prior to reset, with the following exception. If the reset sequence is initiated during a write to a non-volatile status register, the value of that register may be corrupted. The device may always revert back to standard SPI mode after hardware reset.

In particular embodiments, the memory device can be controlled to exit ultra-deep power-down by power cycling the device. For example, the VCC voltage or main power supply to the device can be discharged or otherwise disconnected, and then reapplied. Power-up circuitry can be employed to detect that VCC is at a sufficient level to operate the memory device as part of the powering up process. Thus, if the memory device was in the ultra-deep power-down prior to power cycling the device, once power is reapplied the memory device will have exited the ultra-deep power-down mode. A specified delay (e.g., $t_{PUW}$) or power-up device delay must elapse prior to the memory device accepting program or erase commands. This delay can ensure that the memory device has returned to the standby device, and may include ensuring that the appropriate internal supply levels (e.g., VDD) are at sufficient levels to carry out the given operations. Upon recovery from ultra-deep power-down, all internal registers will be at their power-on default state.

Figure 4:
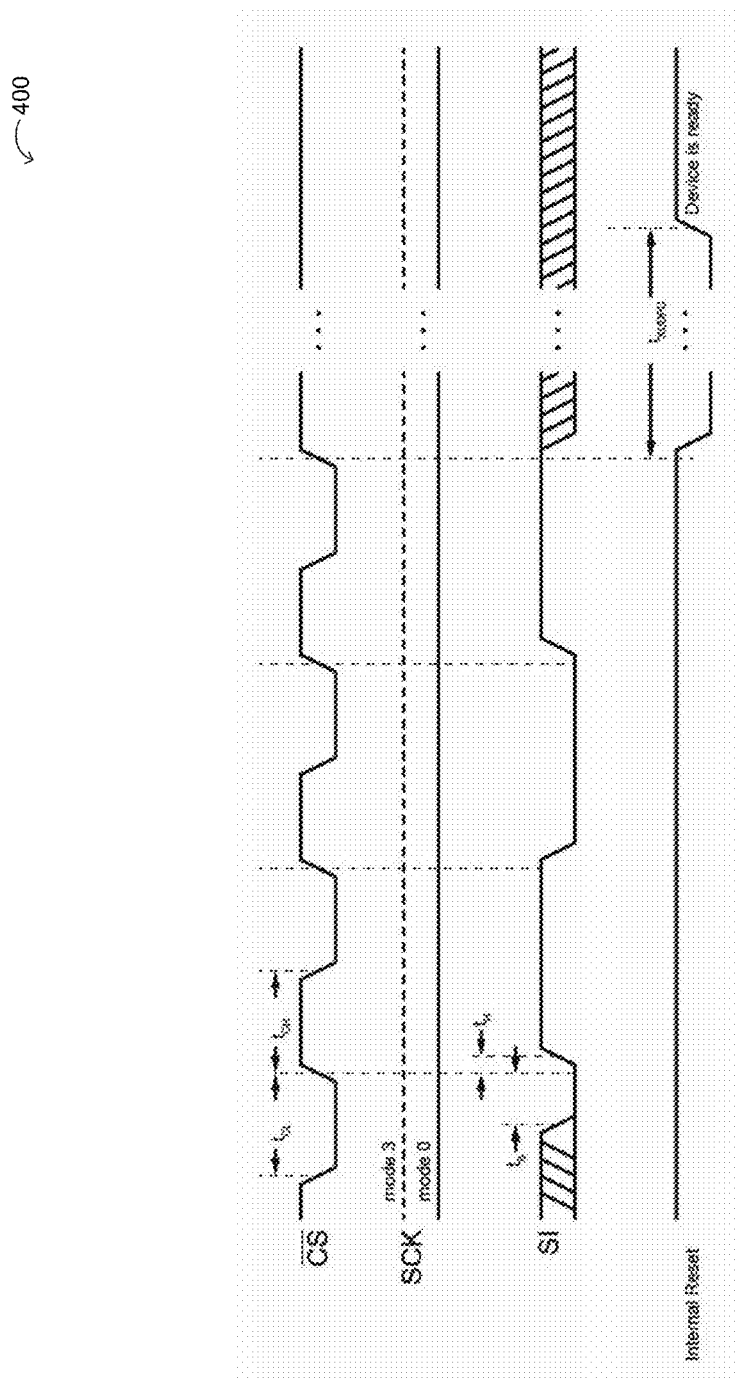
FIG. 4 is a waveform diagram of a first example hardware reset operation to exit ultra-deep power-down mode, in accordance with embodiments of the present invention.

Referring now to FIG. 4, shown is a waveform diagram 400 of a first example hardware reset operation to exit ultra-deep power-down mode, in accordance with embodiments of the present invention. This type of reset operation can also be referred to as a "JEDEC" hardware reset operation due to the specific command normally used in other types of resetting operations. In certain embodiments, this particular command sequence can be employed to exit ultra-deep power-down mode. The reset sequence may not use the SCK pin, and the SCK pin has to be held low (mode 0) or high (mode 3) through the entire reset sequence. This can prevent any confusion with a command, as no command bits are transferred (clocked). A reset/exit can be commanded when the data on the SI pin is 0101 on four consecutive positive edges of the CS_ pin with no edge on the SCK pin throughout.

This is a sequence where first CS_ is driven active low in order to select the device. Clock (SCK) can remain stable in either a high or low state. Also, SI can be driven low by the bus master (e.g., host 102), simultaneously with CS_ going active low. No SPI bus slave may drive SI during CS_ low before a transition of SCK (e.g., slave streaming output active is not allowed until after the first edge of SCK). Also, CS_ can be driven inactive. The slave may capture the state of SI on the rising edge of CS_. Such steps can be repeated 4 times, each time alternating the state of SI. After the fourth such CS_ pulse, the slave may trigger its internal reset. For example, SI can be low on the first CS_, high on the second, low on the third, high on the fourth. This provides a value of 5h, to distinguish from random noise. In addition, any activity on SCK during this time may halt the sequence and a reset may not be generated.

Figure 5:
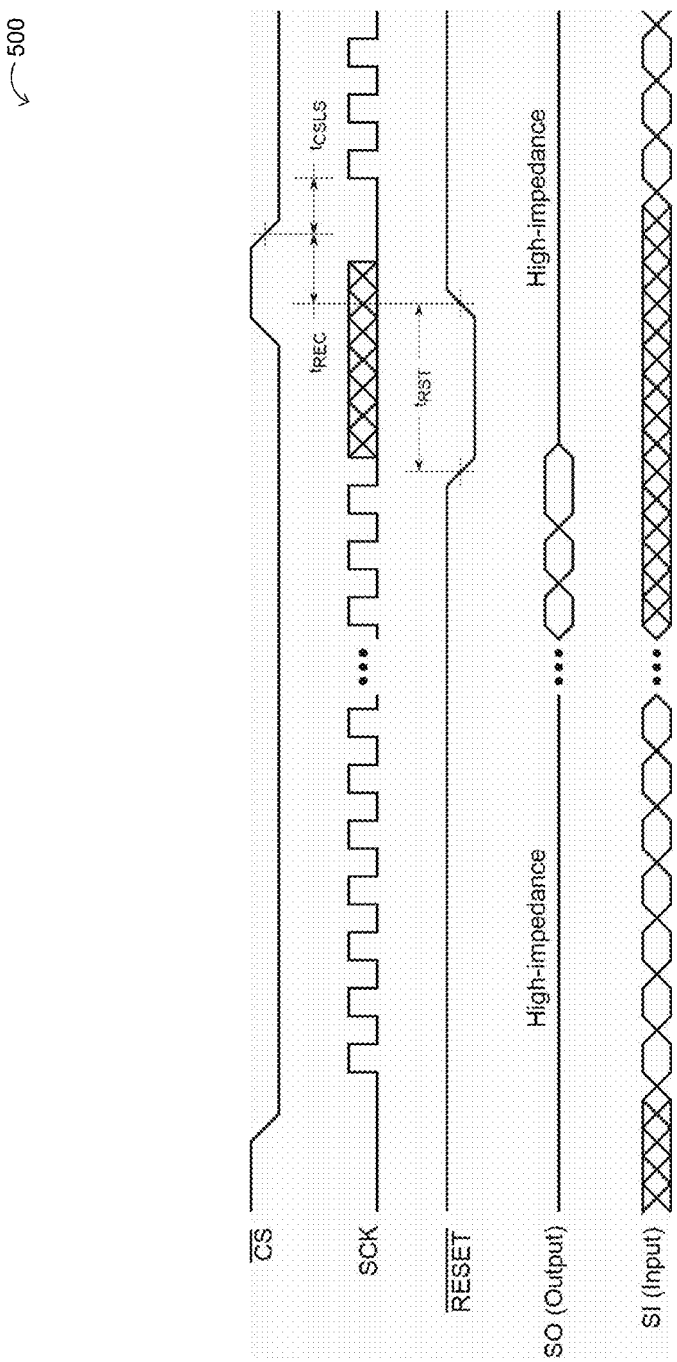
FIG. 5 is a waveform diagram of a second example hardware reset operation to exit ultra-deep power-down mode, in accordance with embodiments of the present invention.

Referring now to FIG. 5, shown is a waveform diagram 500 of a second example hardware reset operation to exit ultra-deep power-down mode, in accordance with embodiments of the present invention. In this example, the hardware reset pin can be used to wake-up the device to exit from the ultra-deep power-down mode. This sequence can also be used to reset the device to a state similar to the power on state without cycling power. The reset sequence in this case does not use any other pins. A low state on the reset pin (RESET_) may terminate the operation in progress and reset the internal state machine to an idle state. The memory device may remain in the reset condition as long as a low level is present on the RESET_ pin. Normal operation can resume once the RESET_ pin is brought back to a high level. The device can incorporate an internal power-on reset circuit, so there may be no restrictions on the RESET_ pin during power-on sequences.

After a hardware reset initiated by the RESET_ pin while the device is in ultra-deep power-down mode, the SRAM buffer 212 may be reset to an undefined value. All volatile status registers may be reset to their default values, except in the following case. If, for example, a given bit in a status/control register was set prior to the last program or erase command, so the device entered the ultra-deep power-down mode after a program or erase command finished, and RESET_ is used to wake up the device from ultra-deep power-down mode, then the write completion status bit may not be reset. In this case, the write completion status bit may still show the correct status after the latest program or erase command. All non-volatile status registers may keep the value they had prior to reset.

After a hardware reset initiated by the RESET_ pin while the memory device is in any other mode than ultra-deep power-down mode, the SRAM buffer may keep the values it had prior to reset, with the following exception. If the reset sequence is initiated during an update of the SRAM buffer, the contents of the SRAM buffer may be corrupted. All volatile status registers may be reset to their default values. All non-volatile status registers may keep the value they had prior to reset, with the following exception. If the reset sequence is initiated during a write to a non-volatile status register, the value of that register may be corrupted. The device may always revert back to the standard/single SPI mode after exiting UDPD via the RESET_ pin/signal.

Figure 6:
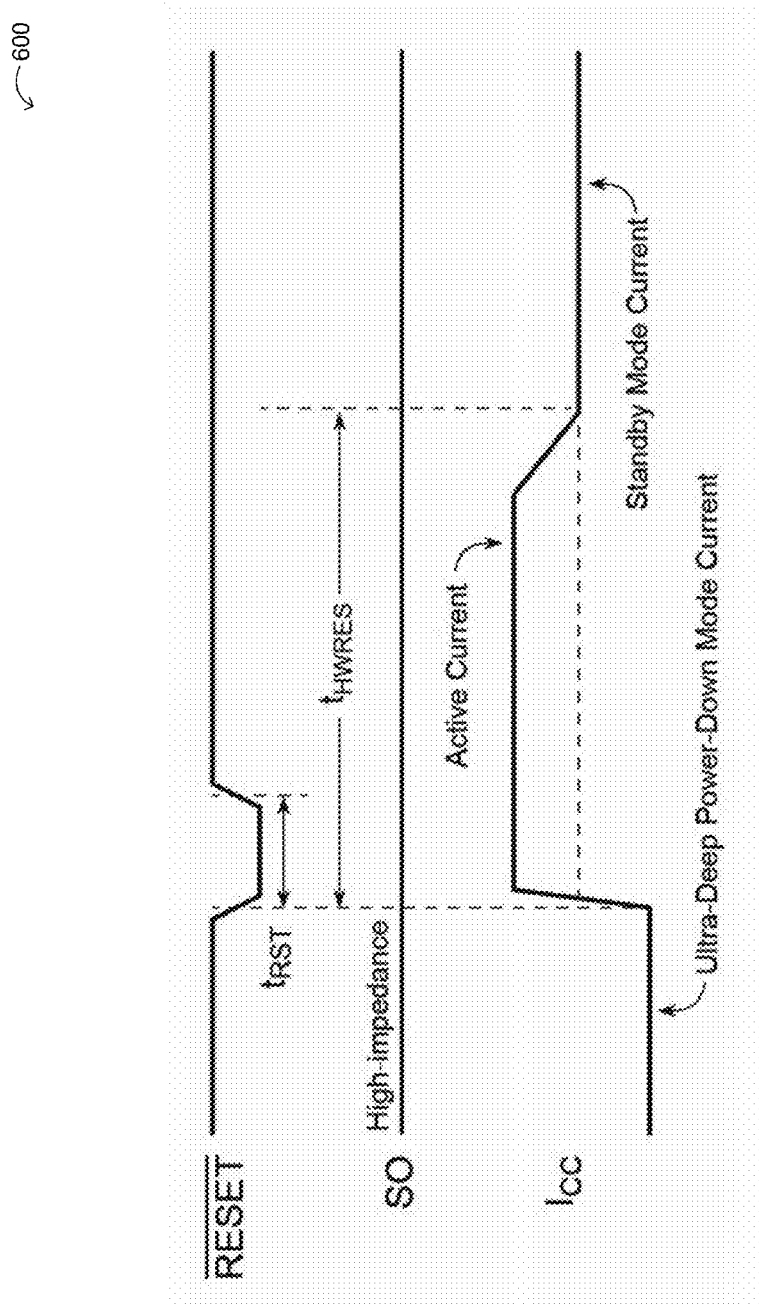
FIG. 6 is a waveform diagram including a power curve of the second example hardware reset operation, in accordance with embodiments of the present invention.

Referring now to FIG. 6, shown is a waveform diagram 600 including a power curve of the second example hardware reset operation, in accordance with embodiments of the present invention. As shown, the RESET_ pin being asserted can exit the memory device from the ultra-deep power-down mode. For example, the RESET_ pin may need to be asserted (e.g., held low) for a predetermined duration (e.g., $t_{RST}$). In response to the falling edge of the RESET_ pin, operating current the memory device may rise to an active current level in order to properly reset internal supplies (e.g., VDD as output from LDO regulator 218) and register states. This process can be completed within a specified hardware reset time (e.g., $t_{HWRES}$), and at that point the operating current can return to a standby mode current once the device enters the standby mode and is ready for normal operation.

Figure 7:
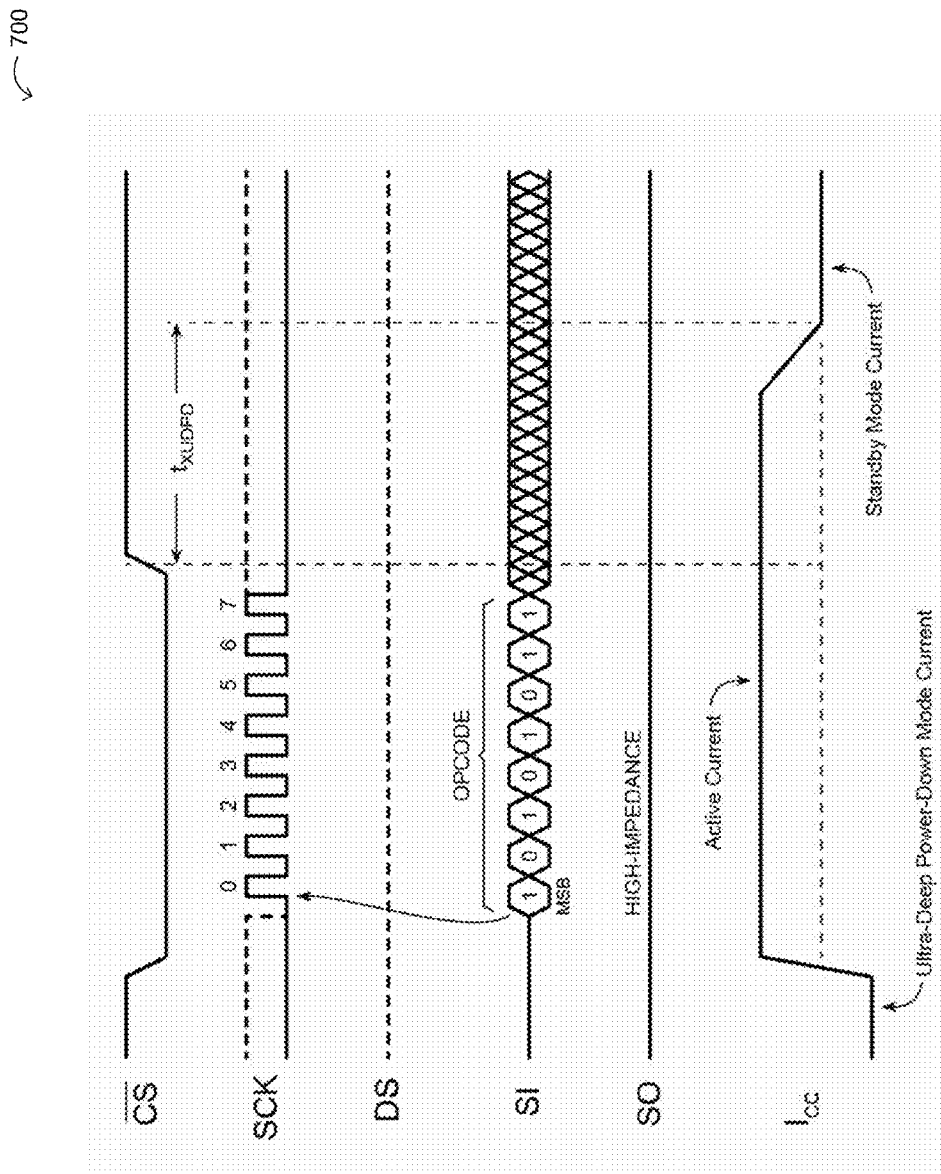
FIG. 7 is a waveform diagram of an example dedicated resume command to exit ultra-deep power-down mode, in accordance with embodiments of the present invention.

Referring now to FIG. 7, shown is a waveform diagram 700 of an example dedicated resume command to exit ultra-deep power-down mode, in accordance with embodiments of the present invention. The resume from power-down mode predetermined/dedicated command (e.g., opcode=ABh) is the only instruction that will wake the device up from the power-down mode or ultra-deep power-down modes. All other commands are ignored when the memory device is in the ultra-deep power-down mode. In this instruction command, after the CS_ pin is brought low, the "RES" or resume instruction can be applied. At the end of the instruction, the CS_ pin can be brought back high. The rising edge of the SCK clock number 7 (e.g., $8^{th}$ rising edge) can initiate the internal RES instruction. The memory device can become available for read and write instructions $t_{PUD}$ or $t_{XUDPD}$ after the $8^{th}$ rising edge of the SCK, as shown.

In one embodiment, a method of controlling a memory device operable in an ultra-deep power-down mode, can include: (i) providing, by an output of a voltage regulator, a supply voltage for a plurality of components of the memory device, where the plurality of components comprises a command user interface, and wherein the memory device comprises a wake-up circuit that remains powered on even when the memory device is in the ultra-deep power-down mode; (ii) entering the memory device into the ultra-deep power-down mode in response to receiving a first predetermined command that causes the output of the voltage regulator to be disabled to completely power down the plurality of components during the ultra-deep power-down mode; and (iii) exiting the memory device from the ultra-deep power-down mode in response to receiving one of a hardware reset command sequence, a reset pin assertion, a power supply cycling, and a second predetermined command, thereby causing the output of the voltage regulator to be enabled to provide power to the plurality of components.

Figure 8:
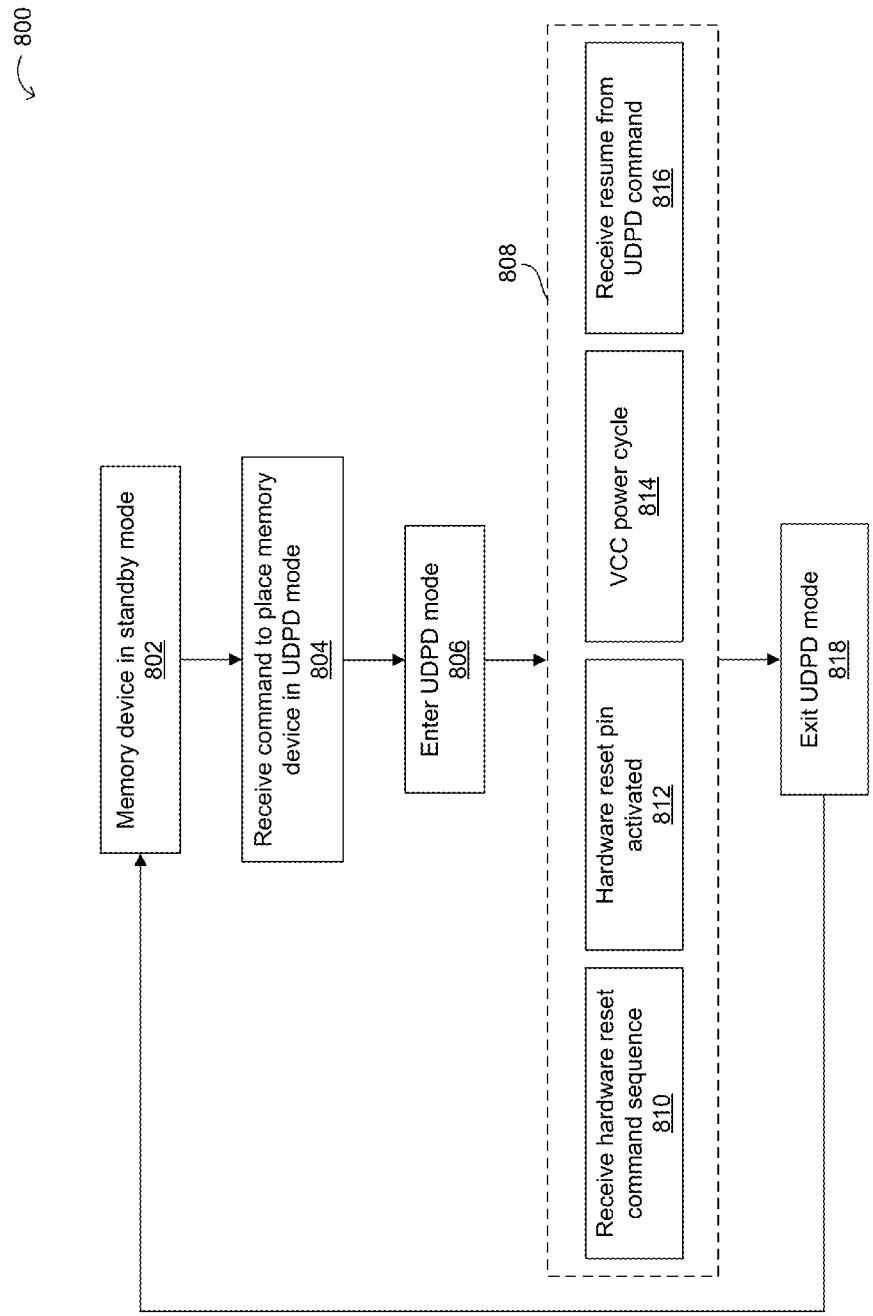
FIG. 8 is a flow diagram of example methods of exiting ultra-deep power-down mode, in accordance with embodiments of the present invention.

Referring now to FIG. 8, shown is a flow diagram 800 of example methods of exiting ultra-deep power-down mode, in accordance with embodiments of the present invention. At 802, the memory device may be in a standby mode (e.g., ready to accept instruction commands). At 804, the memory device can receive a command to be placed in the ultra-deep power-down mode. For example, the command can be a predetermined opcode, such as that shown in FIG. 3. At 806, as a result of this command the memory device can enter the ultra-deep power-down mode.

As discussed above, certain embodiments support a variety of methods of exiting the ultra-deep power-down mode. At 808, any one of the approaches therein can be employed in order to exit the ultra-deep power-down mode. In one example, at 810, a hardware reset command sequence can be received at the memory device (e.g., from a host device). For example, the hardware command sequence, such as that shown above in FIG. 4 can be applied. In response, the memory device can exit the ultra-deep power-down mode at 818, and may return to the standby mode at 802.

In another example, at 812, the hardware reset pin can be activated in order to exit the ultra-deep power-down mode at 818. For example, the RESET_ pin can be asserted as shown above in FIG. 5. As a result of either such hardware reset, the current can return to a standby mode current as part of the standby mode at 802, and as a result of exiting the ultra-deep power-down mode. In another example, at 814, power cycling (e.g., of power supply VCC) can be used to exit the ultra-deep power-down mode. In yet another example, at 816, a predetermined "resume" SPI command can be employed in order to exit the ultra-deep power-down mode. For example, the SPI command as shown above in FIG. 7 can be utilized. In response, the memory device can exit the ultra-deep power-down mode at 818, and may return to the standby mode at 802.

In this way, certain embodiments can support a variety of methods, circuits, mechanisms and/or structures that provide control of exiting the memory device from the ultra-deep power-down mode. While the above examples include circuit, operational, methods, and structural implementations of certain memory devices, one skilled in the art will recognize that other technologies and/or structures can be used in accordance with embodiments. Further, one skilled in the art will recognize that other device circuit arrangements, architectures, elements, and the like, may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A memory device operable in an ultra-deep power-down mode, the memory device comprising:
   a) a command user interface;
   b) a voltage regulator having an output that provides a supply voltage for a plurality of components of the memory device, wherein the plurality of components comprises the command user interface;
   c) a wake-up circuit that remains powered on even when the memory device is in the ultra-deep power-down mode;
   d) the memory device being operable to enter the ultra-deep power-down mode in response to receiving a first predetermined command that causes the output of the voltage regulator to be disabled to completely power down the plurality of components during the ultra-deep power-down mode; and
   e) the memory device being operable to exit the ultra-deep power-down mode in response to receiving one of a hardware reset command sequence, a reset pin assertion, a power supply cycling, and a second predetermined command, thereby causing the output of the voltage regulator to be enabled to provide power to the plurality of components, wherein the reset pin assertion comprises activating the reset pin for at least a predetermined time.

2. The memory device of claim 1, wherein the hardware reset command sequence comprises a chip select signal being activated, a clock signal remaining stable, a serial input signal being driven low simultaneously with the chip select signal being activated, and the chip select signal being deactivated.

3. The memory device of claim 2, wherein the hardware reset command sequence further comprises alternating the state of the serial input signal in three subsequent repetitions.

4. The memory device of claim 1, wherein the power supply cycling comprises disabling a main power supply to the memory device, and then enabling the main power supply.

5. The memory device of claim 1, wherein the second predetermined command comprises an opcode provided on a serial input signal.

6. The memory device of claim 5, wherein the opcode is received over a plurality of cycles of a clock signal.

7. The memory device of claim 5, wherein the opcode is received over a single cycle of a clock signal when the memory device is in an octal configuration.

8. The memory device of claim 1, being configured in a single SPI mode upon exiting the ultra-deep power-down mode.

9. The memory device of claim 1, wherein the second predetermined command excludes a status register read command.

10. A method of controlling a memory device operable in an ultra-deep power-down mode, the method comprising:
    a) providing, by an output of a voltage regulator, a supply voltage for a plurality of components of the memory device, wherein the plurality of components comprises a command user interface, and wherein the memory device comprises a wake-up circuit that remains powered on even when the memory device is in the ultra-deep power-down mode;
    b) entering the memory device into the ultra-deep power-down mode in response to receiving a first predetermined command that causes the output of the voltage regulator to be disabled to completely power down the plurality of components during the ultra-deep power-down mode; and
    c) exiting the memory device from the ultra-deep power-down mode in response to receiving one of a hardware reset command sequence, a reset pin assertion, a power supply cycling, and a second predetermined command, thereby causing the output of the voltage regulator to be enabled to provide power to the plurality of components, wherein the reset pin assertion comprises activating the reset pin for at least a predetermined time.

11. The method of claim 10, wherein the hardware reset command sequence comprises:
    a) activating a chip select signal being activated;
    b) maintaining a clock signal as stable;
    c) driving a serial input signal low simultaneously with the chip select signal being activated; and
    d) deactivating the chip select signal.

12. The method of claim 11, wherein the hardware reset command sequence further comprises alternating the state of the serial input signal in three subsequent repetitions.

13. The method of claim 10, wherein the power supply cycling comprises disabling a main power supply to the memory device, and then enabling the main power supply.

14. The method of claim 10, wherein the second predetermined command comprises an opcode provided on a serial input signal.

15. The method of claim 14, wherein the opcode is received over a plurality of cycles of a clock signal.

16. The method of claim 10, wherein the exiting the ultra-deep power-down mode comprises placing the memory device in a single SPI mode configuration.

17. An apparatus comprising the memory device of claim 1, the apparatus further comprising:
    a) a serial interface coupled between a host device and the memory device; and b) the host device to being configured to provide the first and second predetermined commands, the hardware reset command sequence, and the reset pin assertion on the serial interface.

18. An apparatus, comprising:
a) means for providing a supply voltage for a plurality of components of a memory device that is operable in an ultra-deep power-down mode, wherein the plurality of components comprises a command user interface, and wherein the memory device comprises circuitry that remains powered on even when the memory device is in the ultra-deep power-down mode;
b) means for placing the memory device into the ultra-deep power-down mode in response to receiving a first predetermined command that completely power downs the plurality of components during the ultra-deep power-down mode; and
c) means for exiting the ultra-deep power-down mode in response to receiving one of a hardware reset command sequence, a reset pin assertion, a power supply cycling, and a second predetermined command, thereby providing power to the plurality of components, wherein the reset pin assertion comprises activating the reset pin for at least a predetermined time.

* * * * *